United States Patent [19]

Kung et al.

[11] Patent Number: 4,807,183

[45] Date of Patent: Feb. 21, 1989

[54] PROGRAMMABLE INTERCONNECTION CHIP FOR COMPUTER SYSTEM FUNCTIONAL MODULES

[75] Inventors: Hsiang-Tsung Kung; Feng-Hsiung Hsu; Alan L. Sussman, all of Pittsburgh, Pa.; Teiji Nishizawa, Nara, Japan

[73] Assignee: Carnegie-Mellon University, Pittsburgh, Pa.

[21] Appl. No.: 210,754

[22] Filed: Jun. 23, 1988

Related U.S. Application Data

[63] Continuation of Ser. No. 781,752, Sep. 27, 1985, abandoned.

[51] Int. Cl.[4] .................... G06F 13/00; G06F 15/16; G06F 15/347
[52] U.S. Cl. .................................. 364/900; 364/736
[58] Field of Search ... 364/200 MS File, 900 MS File, 364/736, 754

[56] References Cited

U.S. PATENT DOCUMENTS

| 4,145,751 | 3/1979 | Carlow et al. | 364/900 |
| 4,393,459 | 7/1983 | Huntley et al. | 364/900 |
| 4,644,461 | 2/1987 | Jennings | 364/200 |
| 4,720,780 | 1/1988 | Dolecek | 364/200 |

OTHER PUBLICATIONS

"A Radix 4 Delay Commutator for Fast Fourier Transform Processor Implementation", Earl E. Swartzlander et al., *IEEE Journal of Solid State Circuits*, vol. SC-19, No. 5, Oct. 1984, pp. 702-709.

*Primary Examiner*—Gareth D. Shaw
*Assistant Examiner*—Christina M. Eakman
*Attorney, Agent, or Firm*—Thomas R. Shaffer

[57] ABSTRACT

The interconnection chip of the present invention is a custom chip which is designed to serve as an efficient link between system functional modules, such as arithmetic units, register files and input/output ports. The chip includes a crossbar interconnection, a FIFO or programmable delay for each of its inputs and a pipeline register file for each of its outputs. By using pre-stored control patterns, the chip can configure its crossbar and delays while performing other operations. Therefore, the usual functions of busses and register files can be realized with this single chip. Various embodiments and applications for the chip are disclosed.

16 Claims, 9 Drawing Sheets

PROGRAMMABLE INTERCONNECTION CHIP FOR COMPUTER SYSTEM FUNCTIONAL MODULES

This application is a continuation of application Ser. No. 781,752, filed Sept. 27, 1985, now abandoned.

BACKGROUND OF THE INVENTION

1. Field of the Invention

This invention relates to the interconnection of various types of digital computer system components. More specifically, the present invention provides a single chip which allows many diverse system components to be efficiently interconnected.

2. Description of the Prior Art

Implementation of efficient and low cost special purpose computer architectures which may be utilized for a variety of applications has long been a goal of designers and inventors. The major difficulty in such implementations is not the provision of processing or memory modules since many such components are commercially available. Instead, the problem relates to the interconnection of many diverse system components.

Many existing interconnection components have been proposed and are available which can solve part of the linking problem stated above. For example, general purpose register file chips, first in first out queue (FIFO) chips and programmable array logic (PAL) chips are presently known. None of these chips, however, have yet managed to combine FIFO, crossbar switching and register features on a single chip and at the same time allow for programmable control.

SUMMARY OF THE INVENTION

The present invention has solved the above-identified problem and provides a single interconnection chip which improves on the prior art in that it allows for the production of less costly computer systems which provide far greater performance than would the use of many discrete interconnection components.

In its simplest form, the programmable interconnection chip of the present invention includes a data input buffer means, pipeline register file means, crossbar interconnection means and control pattern memory means. The crossbar interconnection means is electrically connected between the data input buffer means and the pipeline register file means and allows data to flow therebetween. The control pattern memory means is utilized to store programmed instructions designed to control the operations of the crossbar means and the pipeline register file means. By using these pre-stored control patterns, the chip can configure its interconnection and delays while performing other operations. To accomplish such simultaneous operations, the control pattern memory means is preferably configured into two memory banks whereby one bank may be programmed with new control pattern instructions while the other bank controls the operation of the crossbar and pipeline register file means.

Preferably, each data input buffer means is programmed to function as either a FIFO or a programmable delay and includes a plurality of data input ports. Likewise, the pipeline register file means includes a plurality of data output ports. A unidirectional crossbar which only allows data to flow from the input buffer to the pipeline register file means is also preferred.

In one embodiment of the present invention, a delay code register means is provided to control whether each data input buffer means will be configured as a FIFO or a programmable delay means.

The interconnection chip of the present invention is designed to interconnect computer system components which transmit data in data path widths of n-bits. By interconnecting two or more chips it is possible to interconnect components which communicate in data paths wider than n-bits. Moreover, by tri-stating the proper data input and output ports, very wide crossbar interconnections are possible. To facilitate the interconnection of plural chips input ports are preferably provided along one edge of a generally rectangular chip and output ports are provided along an adjacent edge thereof.

It is an object of the present invention to provide a programmable interconnection chip which provides FIFOs, crossbar switching and registers on a single chip.

It is another object of the present invention to provide a single interconnection chip which efficiently performs the functions of many existing discrete interconnection components.

It is yet another object of the present invention to provide such a chip which can be manufactured at a lesser cost than other known interconnection devices.

These and other objects of the present invention will be more fully understood from the following description of the invention on reference to the illustrations appended hereto.

DESCRIPTION OF THE PREFERRED EMBODIMENTS

1. Introduction

Many high-speed, high-density building-block chips are presently becoming commercially available. Notable examples are 32-bit floating-point chips that can perform an arithmetic operation in less than a microsecond. Very powerful systems could be built at low cost if such chips could be efficiently interconnected.

Figure 1:
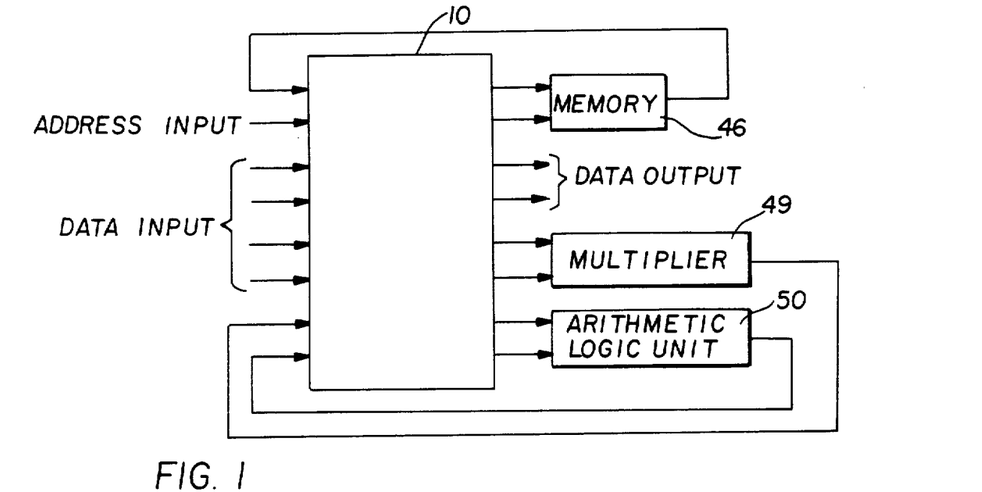
FIG. 1 is a schematic view showing various computer system components linked together with the chip of the present invention.

As depicted in FIG. 1, the link and interconnection chip 10 of the present invention in its presently preferred form provides physical communications and data buffering between functional units of a system such as memory unit 46, multiplier 49 and arithmetic logic unit 50. It can also efficiently implement some complicated data shuffling operations such as the corner turning used in packing bytes into words and unpacking words into bytes.

Chip 10 can significantly reduce chip counts in many systems, especially for highly pipelined processors such as a systolic array processor. In general, chip 10 can efficiently link high-speed, off-the-shelf arithmetic chips together to form powerful microprocessor systems for a variety of applications such as 3-D computer graphics and robot arm control.

The architecture of chip 10 is highly regular. This makes the chip most suitable for custom very large scale integrated circuit (VLSI) implementation.

2. System Overview

This section gives an overview of chip 10 from the perspective of its function within a system and its interface to the outside world.

The signal I/O pins of chip 10, classified into four groups, are listed in the table below.

| INPUT SIGNALS | | OUTPUT SIGNALS | |
|---|---|---|---|
| PIN NAME | ABBRE-VIATION | PIN NAME | ABBRE-VIATION |
| DATA I/O: | | | |
| A input | AI[0-3] | A output | AO[0-3] |
| B input | BI[0-3] | B output | BO[0-3] |
| C input | CI[0-3] | C output | CO[0-3] |
| D input | DI[0-3] | D output | DO[0-3] |
| E input | EI[0-3] | E output | EO[0-3] |
| F input | FI[0-3] | F output | FO[0-3] |
| G input | GI[0-3] | G output | GO[0-3] |
| H input | HI[0-3] | H output | HO[0-3] |
| FIFO CONTROL AND STATUS: | | | |
| Write A-FIFO | WAF | A-FIFO (almost) full | AFF |
| Write B-FIFO | WBF | B-FIFO (almost) full | BFF |
| Read A-FIFO | RAF | A-FIFO (almost) empty | AFE |
| Read B-FIFO | RBF | B-FIFO (almost) empty | BFE |
| CONTROL PATTERN MEMORY ADDRESS: | | | |
| Control address | CA[0-4] | | |
| LOADING AND TESTING: | | | |
| Chip select | CS | | |
| Mode control | MC[0-3] | | |
| Run/~Halt | R/~H | | |
| Reset | RESET | | |
| Ctrl pattern in | CC[0-7] | Ctrl pattern out | CC[0-7] |

(Note that pins CC[0-7] are bidirectional.)

In addition to the signal pins identified in the table above, there are two clock pins (PH11 and PH12), two power pins (VDD1 and VDD2), and two ground pins (GND1 and GND2). Thus chip 10 has a total of 98 pins. Using a standard 100 pin grid array package, chip 10 has two pins reserved for possible future needs.

Figure 2:
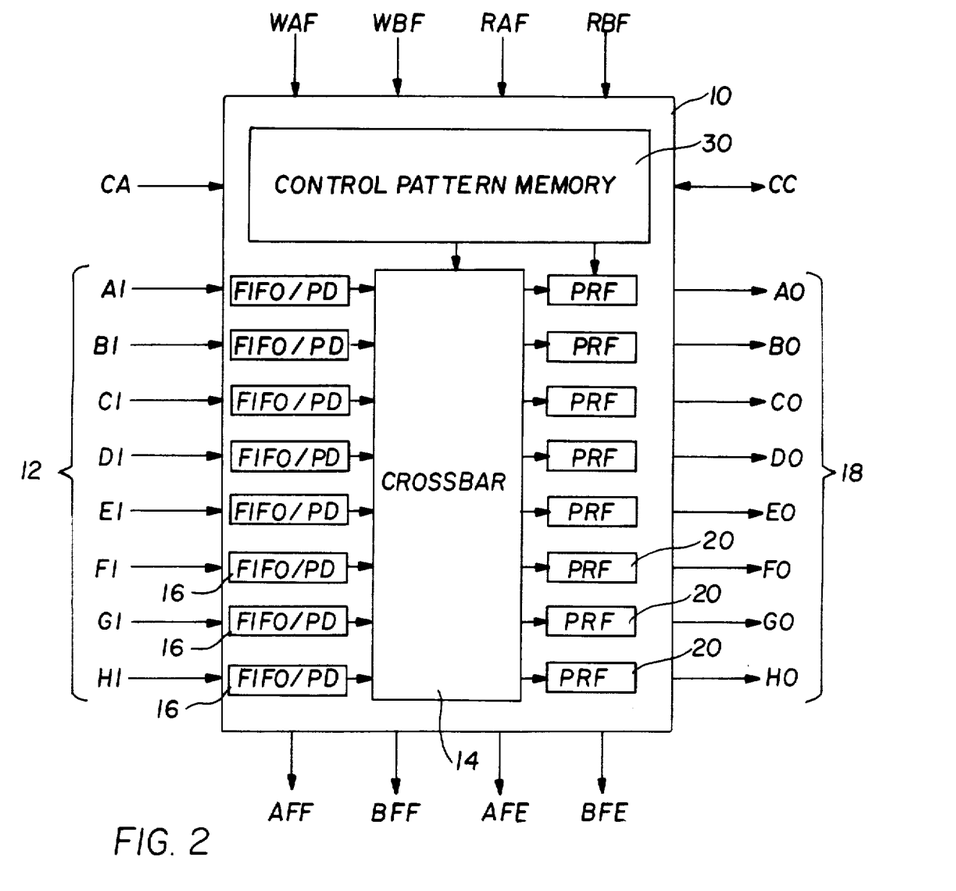
FIG. 2 is a schematic view showing a system overview of the chip of the present invention.

A system overview of chip 10 is depicted in FIG. 2. Either a FIFO or programmable delay (FPD) 16 is provided between each data input port 12 and crossbar 14. A pipeline register file (PRF) 20 is provided between crossbar 14 and each data output port 18. A PRF is a set of registers that shifts in its input in a pipelined manner, but allows random access into the pipeline for its output. The AMD AM29520 is an example of a PRF.

The following is a brief description of the functions of the signal I/O pins in each of the four groups listed in the table above.

Data I/O

Through the data I/O ports 12 and 18, chip 10 can input as well as output eight 4-bit data items simultaneously every cycle. With a cycle time of 100 ns, a total data I/O bandwidth of 80 Mbytes per second can be realized. It is possible to increase the I/O bandwidth further by using multiple copies of chip 10 in parallel.

Figure 3A:
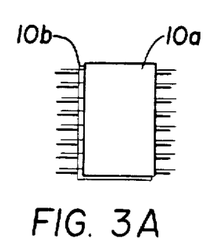
FIGS. 3a, 3b, 3c and 3d are schematic views showing various ways multiple copies of the chip of the present invention may be interconnected to form interconnections with wider data paths than possible with a single chip.
Figure 3B:
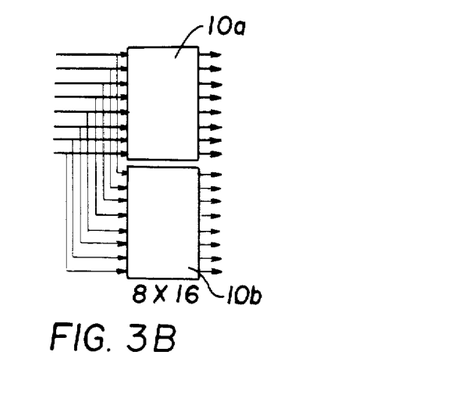
Figure 3C:
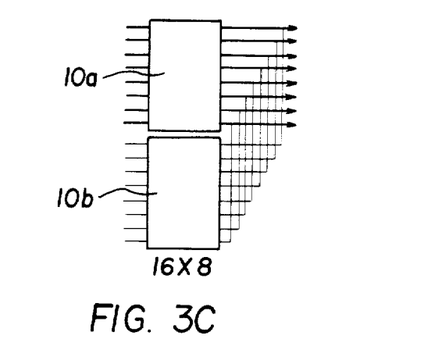
Figure 3D:
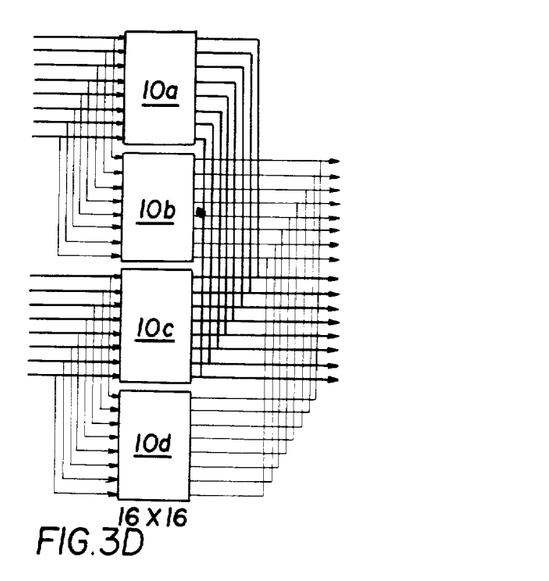

FIG. 3a illustrates that chip 10a and chip 10b can be used in a bit-sliced fashion to form interconnections with data paths wider than 4 bits. FIG. 3b through 3d illustrate that by tri-stating the proper data output pins, multiple copies of chip 10 can form crossbar interconnections larger than 8×8. For example, in FIG. 3b chips 10and 10b are connected to form a crossbar interconnection of 8×16. In FIG. 3c chips 10a, and 10b are connected to form a crossbar interconnection at 16×8. Finally, in FIG. 3d chips 10a, 10b, 10c and 10d are connected to form a crossbar interconnection of 16×16.

Figure 4:
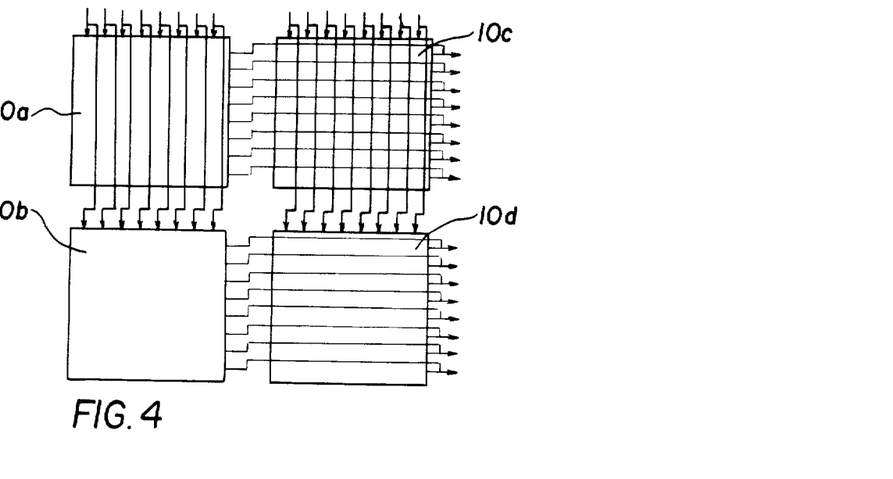
FIG. 4 is a schematic view showing a compact layout for the crossbar interconnection of FIG. 3d.

When the input and output ports of chips 10a, 10b, 10c and 10d are provided respectively along the top and right boundaries of the chips then the 16×16 crossbar interconnection of FIG. 3b can be laid out in a regular and compact manner, as shown in FIG. 4. It will be obvious to those skilled in the art that this layout scheme may be generalized to implement even larger crossbar interconnections.

FIFO Control and Status

Chip 10 can be configured to have up to two FIFOs, designated as an A-FIFO and a B-FIFO. The FIFOs' widths can be set by programmers in 4-bit increments, but the total width of the two FIFOs cannot be more than 32-bits (the total width of the eight input data ports). Input data ports 12 which are not configured as FIFOs are configured as programmable delays. Typically, the programmable delays are used to equalize the lengths of various pipelines for different arithmetic units in the same system.

Figure 5:
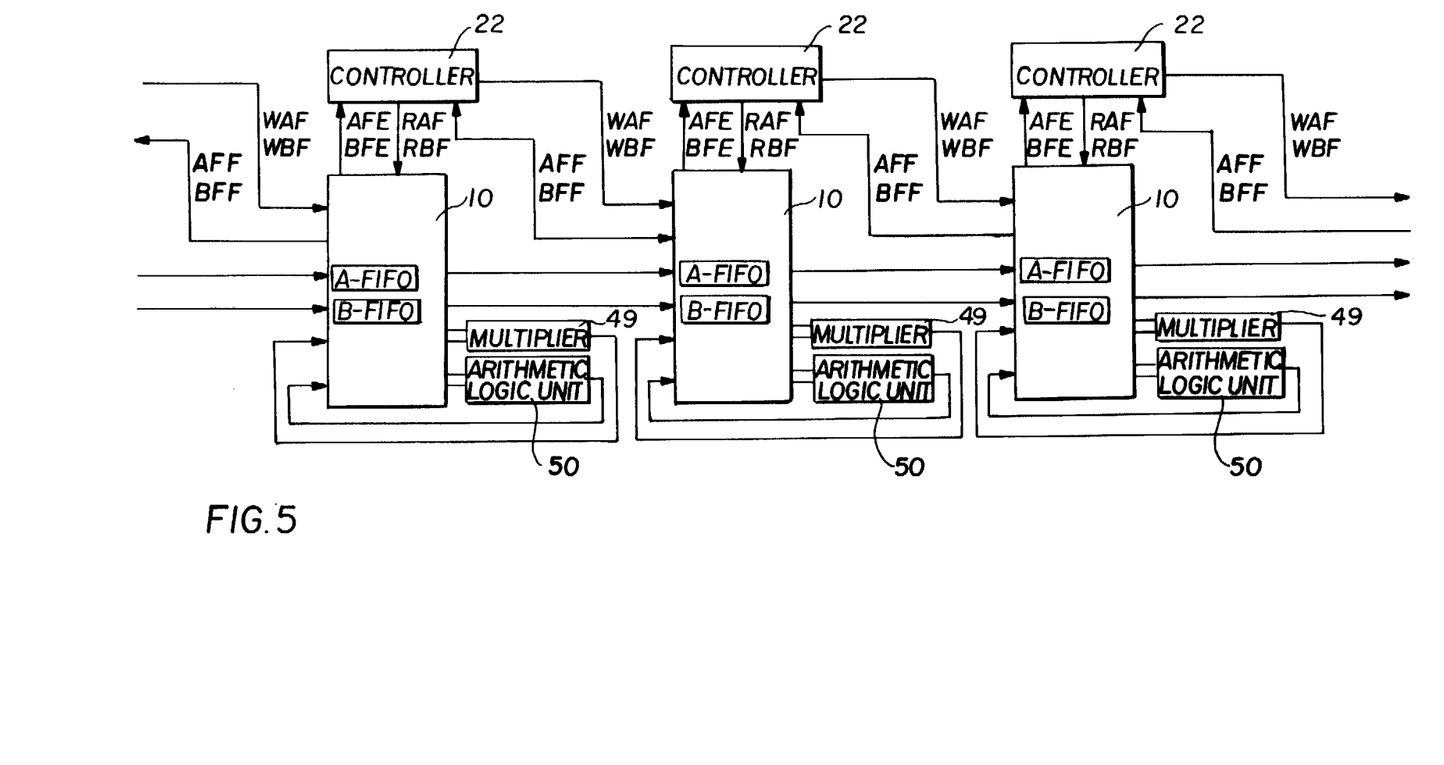
FIG. 5 is a schematic view showing the use of control and status signals in cooperating multiple systems.

The FIFOs of chip 10 can be used to buffer data coming from other systems at varying rates. FIG. 5 depicts a simple collection of cooperating systems wherein each system receives data from the system to the left. The controller 22 of each system sends FIFO read requests (RAF,RBF) to chip 10 of the same system, but sends FIFO write requests (WAF,WBF) to the chip of the system to the right. The chip of each system sends its FIFO status signals AFE and BFE (empty or almost empty) to the controller 22 of the same system, but sends status signals AFF and BFF (full or almost full) to the controller 22 of the system to the left. A status signal may be sent before a FIFO becomes completely full or empty, to give sufficient time for the signal to reach the controller.

Control Pattern Address

The crossbar 14 and pipeline register file 20 of chip 10 may use a new control pattern every cycle. Since a control pattern has 64 bits, it is not practical to input all of these bits to chip every cycle. Instead, a 5-bit address, CA[0-4], is sent to the chip 10 every cycle, to fetch one of the 32 control patterns pre-stored in one of the two banks of the control pattern memory 30 of the chip.

Loading and Testing

The control pattern memory 30 has two banks, with 32 words each, so that while one bank is in use the other bank can be loaded with new patterns via pins CC[0-7]. The control register 28 for the FIFOs/programmable delays 16 can be loaded with new contents via pins CC[0-7]. The control pattern memory 30 and the control register 28 should be loaded before the chip starts running. Chip 10 can be configured through the mode control pins to test the control pattern memory 30, the FIFO/programmable delay control register 28, and the datapath.

3. Datapath and Control

Figure 6:
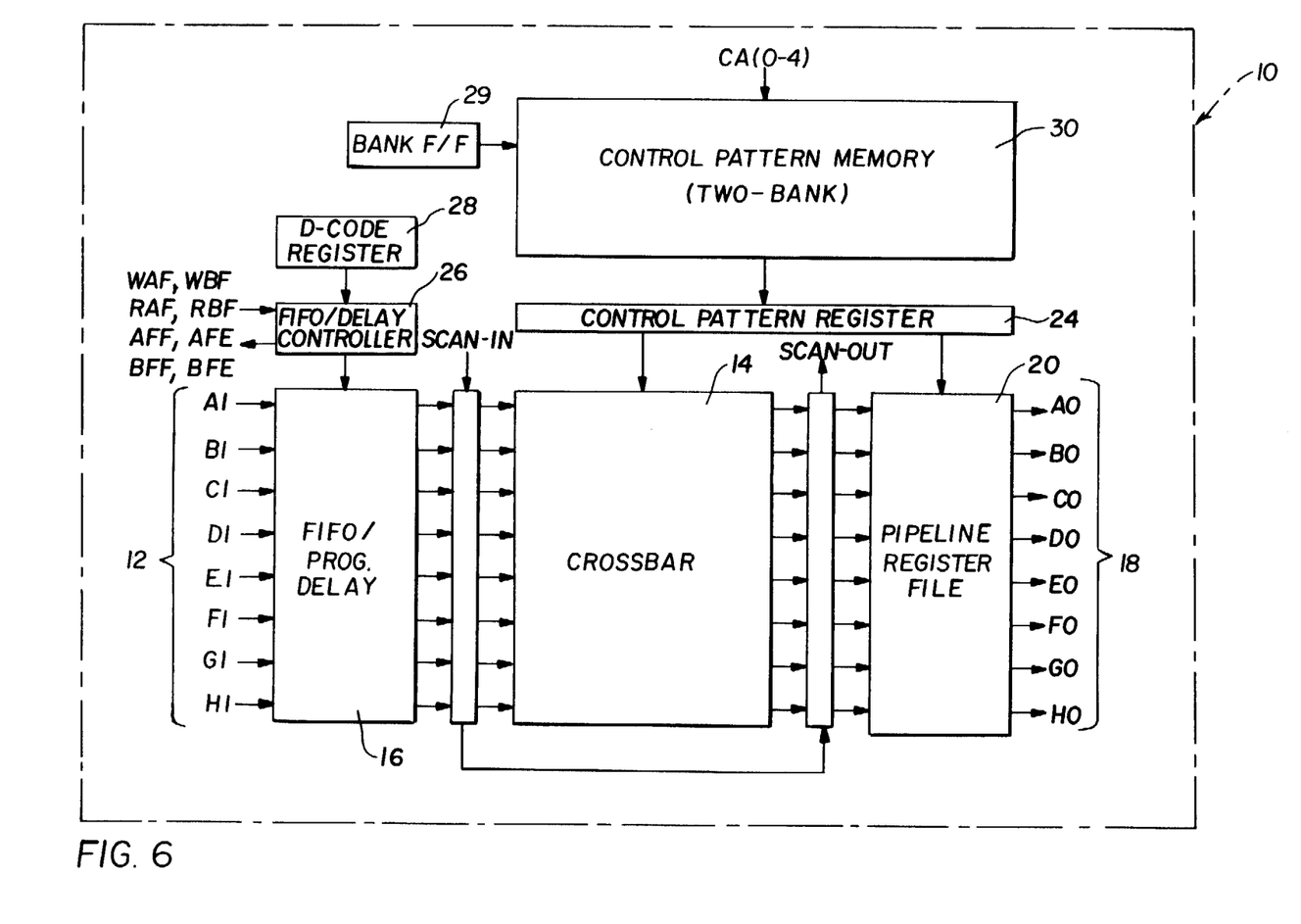
FIG. 6 is a schematic view showing a datapath block diagram of the chip of the present invention.

A functional block diagram of chip 10 is shown in FIG. 6. In the following we discuss the main functional features of chip 10.

Datapath

The datapath operates with a 100 ns minimum cycle time. Every I/O port 12 and 18 is capable of performing one data transfer per cycle. This gives a 40 Mbytes/sec input transfer rate with all of the eight 4-bit input ports active, and a 40 Mbytes/sec total output transfer rate for the eight 4-bit output ports. The datapath consists of eight FPD's 16 (FIFO and/or programmable delay), an 8×8 4-bit wide crossbar 14, and eight pipeline register files 20. There is a minimum delay of 2 clock cycles before an input can appear at an output port. The control flow from the control pattern register 24 is matched to the data flow so that the entire transfer of each data item is controlled by the pattern in the control pattern register 24 when the transfer starts, even though the transfer actually takes 2 clock cycles. The net effect of this arrangement is that the programmer can view the chip as having zero internal delay across the FPDs 16, the crossbar 14, and the pipeline register files 20, but having a 2-cycle delay at the output ports 18.

FIFO's and/or Programmable Delays

The eight FPDs 16 can be configured by delay code register 28 into 0, 1 or 2 FIFOs and/or 0 to 8 4-bit wide programmable delays. The FIFOs widths can be set by the programmer in 4-bit increments, but the total width of the FIFOs cannot be more than 32-bits. Each FPD 16 can be selected to be part of one FIFO or as a programmable delay. For example, chip 10 can be configured to have two 8-bit wide FIFOs and four 4-bit wide programmable delays. The programmable delay time can vary from 0 to 31 cycles. The two FIFOs, each 31 deep, are controlled by the off-chip signals WAF, WBF, RAF and RBF. Notice that the outputs of the FPDs, even when configured as FIFOs, go to the on chip crossbar 14 rather than off-chip directly. Because there are logic delays inside chip 10 in sending out FIFO status signals (AFF/AFE and BFF/BFE), these signals refer to an "almost full" or "almost empty" status. "Almost full" means that the FIFO has at most two empty slots left, and "almost empty" means that the FIFO holds at most two valid items. The configuration of the FPDs is determined by a 64-bit wide control register, called the d-code register (delay code register 28), which is loaded before system execution begins and normally does not change very often thereafter.

Crossbar

An 8×8 4-bit wide crossbar 14 connects the FPDs 16 to the pipeline register files 20. The crossbar 14 is unidirectional. The inputs come from the FPDs 16 and the outputs go to the pipeline register files 20. The control for the crossbar comes from a 24-bit field in the control pattern register 24. In this way, the crossbar interconnection means is configured to provide a desired interconnection pattern between FPDs 16 and pipeline register files 20. Each output port of crossbar 14, is controlled by 3 bits and can accept any of the eight input values.

Pipeline Register Files

At the output of crossbar 14 eight 4-bit wide pipeline register files (PRFs 20) are provided. Each PRF 20 has fourteen stages, and uses one bit in the control pattern register to decide whether or not to shift in the current crossbar output. The output of each PRF 20, which also serves as one of the output ports 18, is specified by a 4-bit field in the control pattern register to be either one of the fourteen stages, the crossbar output, or high-impedance.

Control

Control Pattern Memory and Control Pattern Register

The control pattern memory 30 and the control pattern register 24 determine the operation of the crossbar 14, and the pipeline register files 20. The control pattern memory 30, a 64×64 static random access memory (RAM), is configured as two 32-word banks. One bank can be loaded with new control patterns while the other is controlling the data flow. Bank flip flop 29 determines which memory bank controls the data flow. A 5-bit off-chip address, CA[0-4], selects the control pattern from the bank currently controlling the chip. The control pattern register 24 can be thought of as holding the pattern addressed in the last cycle and controlling the circuit behavior at the current cycle although this is not entirely true. Because of the requirement to match the control flow with the data flow, the part of the control pattern that controls the PRFs will still be active on the next cycle.

FPD Control

Each FPD 16 is controlled by an 8-bit field in the d-code register 28. Two bits are used to decide whether the FPD 16 is a programmable delay, or part of the A-FIFO or B-FIFO. The other five bits are a count field. For a programmable delay, the count specifies the fixed length of the delay, and is set when loading the d-code register 28. For a FIFO, the count contains the current length of the FIFO. When loading the d-code register 28, it is necessary to set the count field of the register to zero, effectively creating an empty FIFO. A new d-code can be loaded into a shift register (not shown) whose contents can then be transferred to the d-code register 28 in one cycle. The shift register is byte-wide and can be loaded through the CC bus in 8 cycles. The loading of the shift register can be performed when the chip is running or is halted.

External Control

The run/~halt pin controls the running state of the chip 10. When the run pin becomes inactive, all the circuits except the FIFO circuits and loading/testing circuits become inactive. After the reset pin is active for more than one cycle, the eight data output ports 18 become high impedance. This is useful in avoiding spurious outputs when loading the control codes into a chip for the first time.

4. Application Examples

Corner Turning

Functional units of a system often have different data input and output formats. As a result, outputs of a unit may have to be reassembled before they can be used as inputs to another unit. A reassembling operation that occurs frequently is known as "corner turning". Corner turning can be efficiently carried out with chip 10 of the present invention.

Figures 7A, 7B:
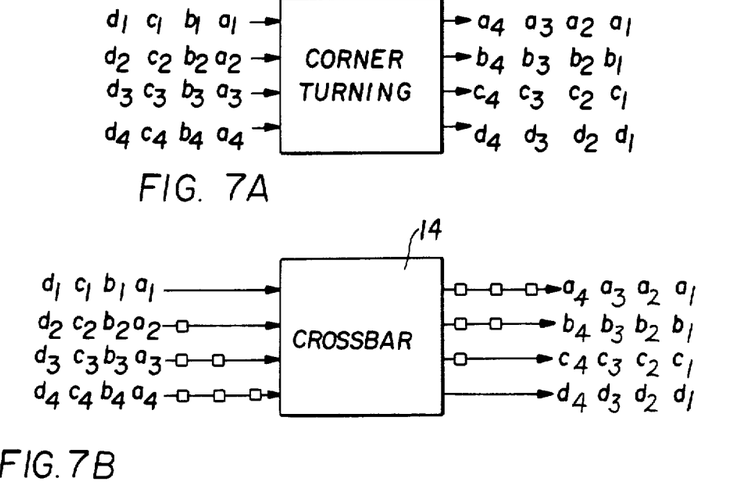
FIGS. 7a and 7b are schematic views showing how the chip of the present invention can be utilized for corner turning operations.

The corner turning operation is like matrix transposition. For example, it may be necessary to transpose an input matrix in column-major ordering to an output in row-major ordering. Such a corner turning operation is illustrated in FIG. 7a. Corner turning operations are needed, for example, in preparing input data for some systolic arrays and in packing bytes into words and unpacking words into bytes.

Referring to FIG. 7a, inputs $a_1$, $a_2$, $a_3$ and $a_4$ all arrive at the same time, but must be buffered to allow output from the same output port serially. It is easy to see from FIG. 7b that by providing buffer delays both before and after a crossbar, the corner turning can be accomplished. Since chip 10 does provide these buffering facilities and the crossbar, it can implement the entire corner turning operation.

Figure 8:
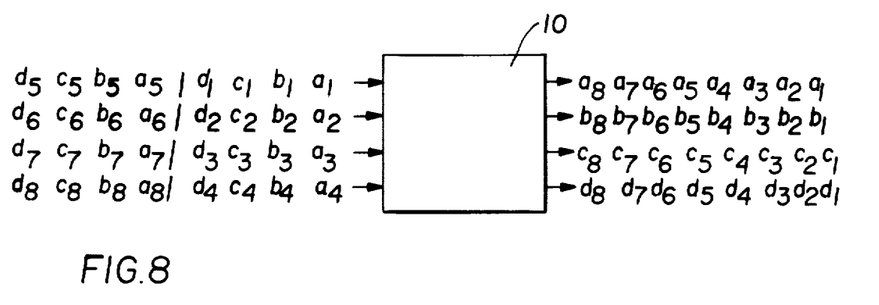
FIG. 8 is a schematic view showing how the chip of the present invention can be utilized to transpose a large matrix.

For transposing large matrices, multiple copies of chip 10, as depicted by FIGS. 3b, 3c, 3d and 4 may be used. Alternatively, a single copy of chip 10 can be multiplexed in time. FIG. 8 shows that an 8×4 matrix may be transposed by transposing the first four rows of the matrix followed by the remaining four rows. Of course, if the size of the matrix exceeds that of the programmable delays and pipeline registers of chip 10, additional buffers outside chip 10 must be used.

As its datapath indicates, chip 10 can buffer input at its input ports, and send them through the crossbar to any of the output ports, where data can again be buffered by the pipeline register files. These features seem to be general and powerful. Corner turning is just one example of many data shuffling operations that chip 10 can efficiently implement.

Systolic Array Implementation

Figure 9:
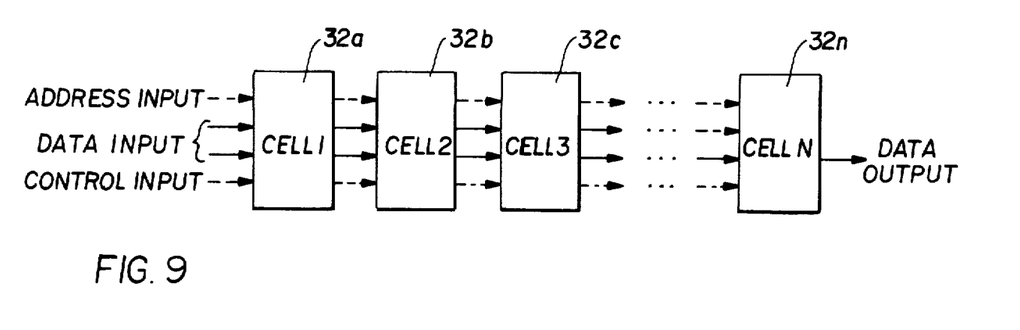
FIG. 9 is a schematic view of a systolic array processor.

FIG. 9 illustrates a one-dimensional systolic array that takes inputs from one end cell 32a and produces outputs at the other end cell 32n, with data and control all flowing in one direction. This type of systolic array can perform various transformations in signal and image processing at very high speed.

Assume that each cell 32 of the systolic array processor uses a pipelined 32-bit floating-point chip set that can perform 10 million floating-point operations per second (MFLOPS). A 10-cell processor can process 1024-point complex FFTs at a rate of one FFT every 600 μs. Under program control, the same processor can perform many other primitive computations in signal, image and vision processing, including two-dimensional convolution and complex matrix multiplication, at a rate of 100 MFLOPS. Together with another processor capable of performing divisions and square roots, the processor can also efficiently carry out a number of difficult matrix operations such as solving covariant linear systems, a crucial computation in real-time adaptive signal processing.

Figure 10:
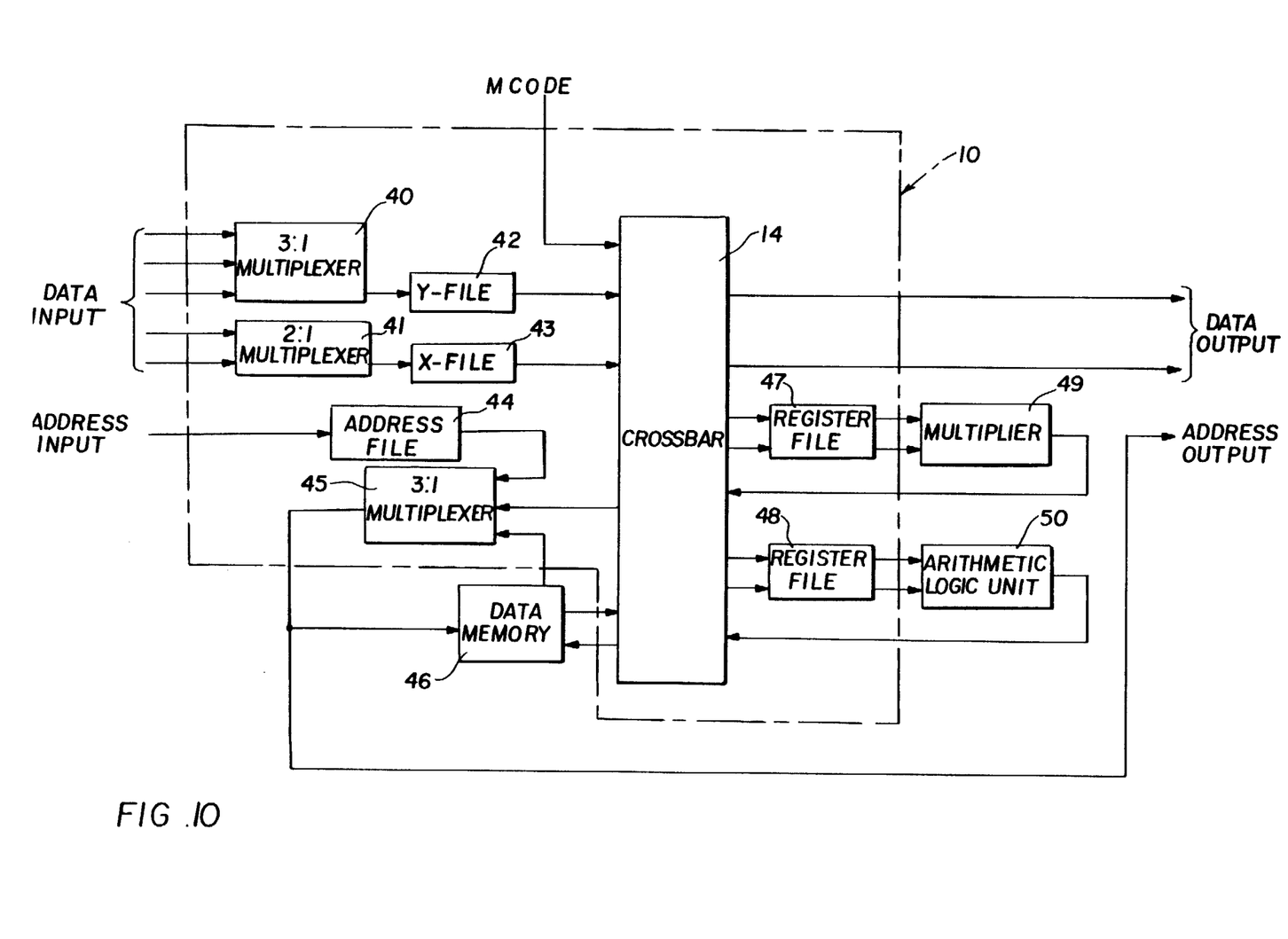
FIG. 10 is a schematic view showing the systolic array of FIG. 9 implemented with the interconnection chip of the present invention.

FIG. 10 summarizes an example datapath for each cell of a systolic array processor. It is noted that all the components inside the region surrounded by the dotted lines are "glue chips" and they can be implemented efficiently with the chip of the present invention. Chips 40, 41 and 45 are multiplexer chips. Chips 42, 43 and 44 are register files or memory chips utilized to provide a desired delay. The crossbar is designated 14 and register files 47 and 48 are associated respectively with multiplier 49 and arithmetic logic unit 50. Chips 46 are a set of data memory chips.

Figure 11A:
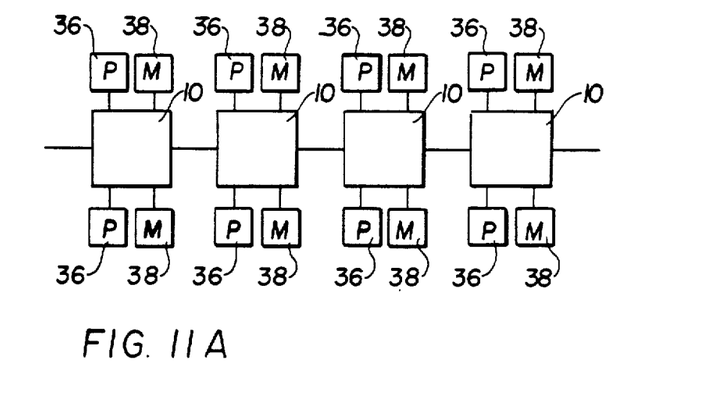
FIGS. 11a and 11b are schematic views showing processor arrays implemented with the interconnection chip of the present invention.
Figure 11B:
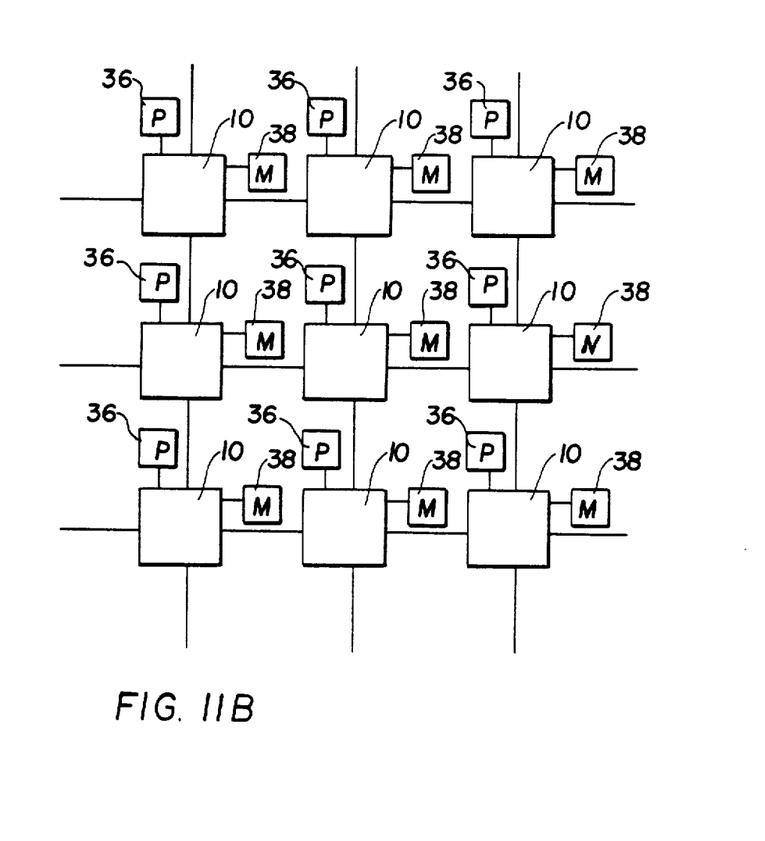

In general, through the chip of the present invention, processors (P) 36 and memories (M) 38 can be linked together to form various processor arrays, as illustrated in FIGS. 11a and 11b.

Fast Fourier Transform

An n-point fast Fourier transform (FFT) may be carried out on a processor implemented with the chip of the present invention. Based on a scheme originally proposed for a systolic array processor, this operation will be described.

The FFT uses $\log_2 n$ stages of n/2 butterfly operations, with data shuffling between stages. The so-called constant geometry version of the FFT allows the same pattern of data shuffling between all stages.

In the systolic processor array, the butterfly operations for the i-th stage of the FFT are executed by cell i, and the results are stored to the data memory of cell i+1. The data memory of each cell is double buffered, so that cell i can write into the data memory of cell i+1 while cell i+1 is working on stage i+1 of another FFT problem. In this way, if many FFTs are to be performed, all cells in the array can be kept occupied at all times.

Figure 12:
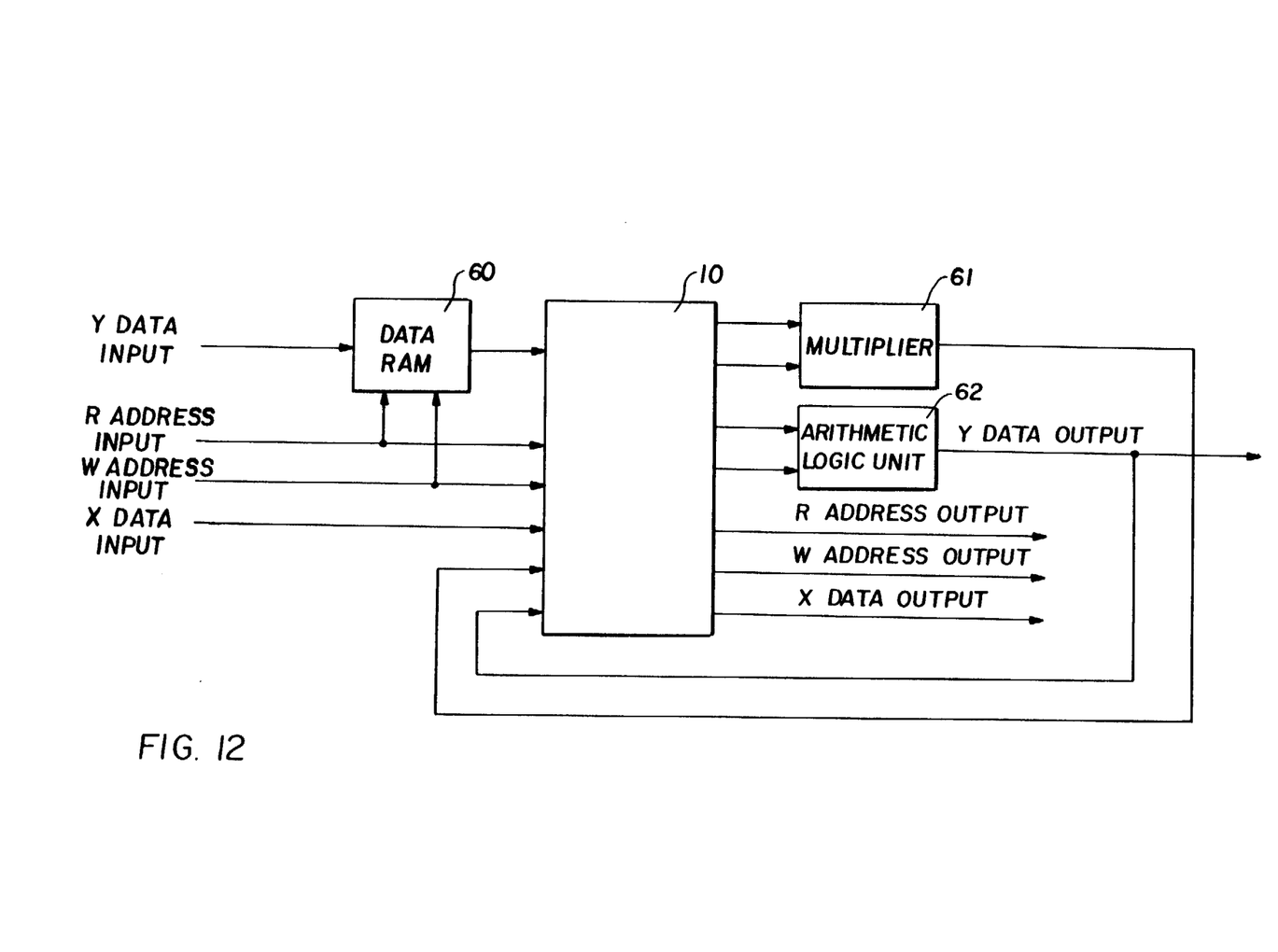
FIG. 12 is a schematic view showing a cell of a constant geometry fast Fourier transform (FFT) processor utilizing the chip of the present invention.

FIG. 12 shows the cell block diagram including a data RAM bank 60 with chip 10 controlling all data flow to multiplier 61 and arithmetic logic unit 62.

A butterfly operation is described as:

$$(a_r + ja_i) \pm (b_r + jb_i) \cdot (w_r + jw_i) = [a_r \pm (b_r \cdot w_r - b_i \cdot w_i)] + j[a_i \pm (b_r \cdot w_i + b_i \cdot w_r)],$$

requiring four real multiplications and six real additions. Using chip 10 to control the data flow, it is possible to fully occupy the arithmetic logic unit (ALU) 62 so that it actually takes the minimum of six cycles to do a butterfly. This is accomplished by interleaving up to four different bufferfly operations in all cells at all times. Chip 10 solves the problem of reusing the inputs to each butterfly twice, by storing such inputs inside chip 10 and reading them out at the appropriate times.

The data streams for chip 10 and for the cell will now be defined. The cell y-data stream provides the input for the data memory and is written into the address provided by the w-address stream. The r-address stream provides the read address for the data memory, and the data memory provides the butterfly inputs ($a_r$, $a_i$, $b_r$, $b_i$) for chip 10. The weight inputs for the butterfly operations ($w_r$, $w_i$) are provided by the x-data stream. There are also feedback loops in the cell from the outputs of the ALU 62 and multiplier 61 back to the inputs of chip 10. This allows chip 10 to control the correct accumulation of the results of the butterfly. The cell y-output is the output from the ALU 62, while the rest of the output streams are simply the corresponding input streams, delayed by two cycles (the pipeline delay of chip 10). All data streams pass systolically from cell to cell, including addresses for the data memory. This is a good reason to implement the FFT in the constant geometry version, because the method uses the same data shuffling between all cells.

Programming chip 10 for this application is not a difficult task. As we have already noted, data shuffling is the same between all cells, which means that all cells require the same chip 10 control. A total of eight different control patterns are used, six for the main loop of the FFT and two more to allow for the case of shifting in new weights for the current butterfly operation. The decision on whether to shift in new weights is made by the cell controller. The general method by which chip 10 controls the data for a butterfly operation is quite simple. First, it buffers $b_r$ and $b_i$ in one pipeline register file connected to the multiplier, and the corresponding weights in the other pipeline register file connected to the multiplier. Then, as the multiplier computes the products they are sent back through chip 10 and buffered in the pipeline register files connected to the ALU 62. As soon as both operands are available, they are sent to the ALU 62 to continue the butterfly operation. Once the ALU 62 finishes this set of computations, the results are sent back through chip 10 once again, buffered as inputs to the ALU 62, and used as operands with $a_r$ and $a_i$ (which are also buffered), to produce the final cell outputs. The important point to notice is that chip 10 provides the flexibility necessary to regulate several data streams concurrently, without inserting unnecessary empty cycles to note that up to four different butterfly operations are going on simultaneously in one cell, but that chip 10 can handle all the necessary control with only eight control patterns.

Robot Arm Control

The problem of controlling a robot manipulator can best be described as a problem in transforming the easily specified desired Cartesian (world) coordinates into the arm's joint coordinates. These transformations are defined by a set of homogeneous transformations, each of which is a 4×4 matrix which when applied to a coordinate's 4-vector (x,y,z and scale) transforms it into another 4-vector. The standard transformations include translation, rotation, stretching and scaling. Since the major computational problem involved is that of matrix multiplication (composing the necessary homogeneous transformations to transform Cartesian to joint coordinates), a systolic array to perform matrix multiplication could provide the necessary computational power for robot arm control.

The systolic cell requires buffering for both data streams associated with the matrices being multiplied, and also for the result data stream. The cell would look exactly like FIG. 12, with the only difference between such a cell and an FFT cell being the programming of chip 10 and the cell controller The matrices we are discussing are 4×4, so a four cell systolic array could process a single matrix multiplication in exactly sixteen cycles, since we know that by interweaving independent matrix multiplications a new task can enter each ALU every cycle. This implies that, with a 200 ns arithmetic unit cycle time, it would take 3.2 μs to do a single matrix multiply.

Two robot arm problems that illustrate the necessity for the powerful processing elements described above are that of generating the robot arm joint position error and joint velocity set points. The equations for solving these problems involve composing many homogeneous transformations and computing inverse homogeneous transformations, both of which require many scalar multiplications (to compute matrix products and inner products, respectively). The equations needed to solve these problems are quite complex, but what is more important is calculating the necessary requirements on computing the solutions. One part of the solution derivation requires a computation of approximately 2000 multiplications (scalar, not matrix) to do the necessary matrix multiplications. The time delay in computing the joint servo of a typical robot arm is important in determining the computation rate, and requires a delay of less than 250 μs. This is well within the capability of a systolic array, which can do the 2000 multiplications in $(\frac{1}{4})\cdot(2000)\cdot200$ ns ($=100$ μs). Then the evaluations of the two set points can be done, requiring approximately another 1000 multiplications within the same 250 μs delay, which is also easily met by the systolic array's capabilities.

Robot arm control is clearly amenable to applying the computational power of a systolic array based on the chip of the present invention. It seems that the task requires too much computation in too short a period of time for a conventional architecture to be able to handle it effectively, and any other method of solving the problem requires approximation algorithms that are not completely adequate for the task. As a measure of how cost-effective we expect the chip of the present invention to be in doing this task, we know that a systolic array processor board can handle the computations described above, and such a board would require only 45 chips when using the chip of the present invention. The flexibility available in programming the present chip to control data flow and the computational power of a systolic array can be a major help in alleviating the computational difficulties of robot manipulator control.

3-D Computer Graphics

Hardware for high performance three-dimensional computer graphics can be viewed as consisting of two main parts:

a geometry system and a display system. The geometry system transforms object descriptions in world coordinates into descriptions in normalized device coordinates. The display system eliminates hidden surfaces and outputs each pixel to a raster-scan display. There have been several attempts to apply VLSI technology to both systems. In comparing the two systems, the geometry system requires many floating-point operations and is appropriate for implementation with the chip of the present invention and floating-point processors, whereas the display system needs sorting operations of fixed-point values. Although the present chip could be useful in implementing the display system we will not explore that idea at the present time. We will now discuss further the architecture of the geometry system.

There are three tasks in the geometry system:
Matrix multiplication

For the transformation from world to normalized device coordinates, we need to perform homogeneous transformations defined by 4×4 matrices. The computation involves many matrix-vector multiplications.

Clipping

The transformed data in normalized device coordinates are clipped into the space which a viewer can see through a virtual window. In world coordinates, this space corresponds to a truncated viewing pyramid with "front" and "back" planes.

Scaling

This step transforms the data in a homogeneous coordinate system [x, y, z, w] (where w is a scaling factor) result from clipping, into another coordinate system [x', y', z', 1].

Figure 13:
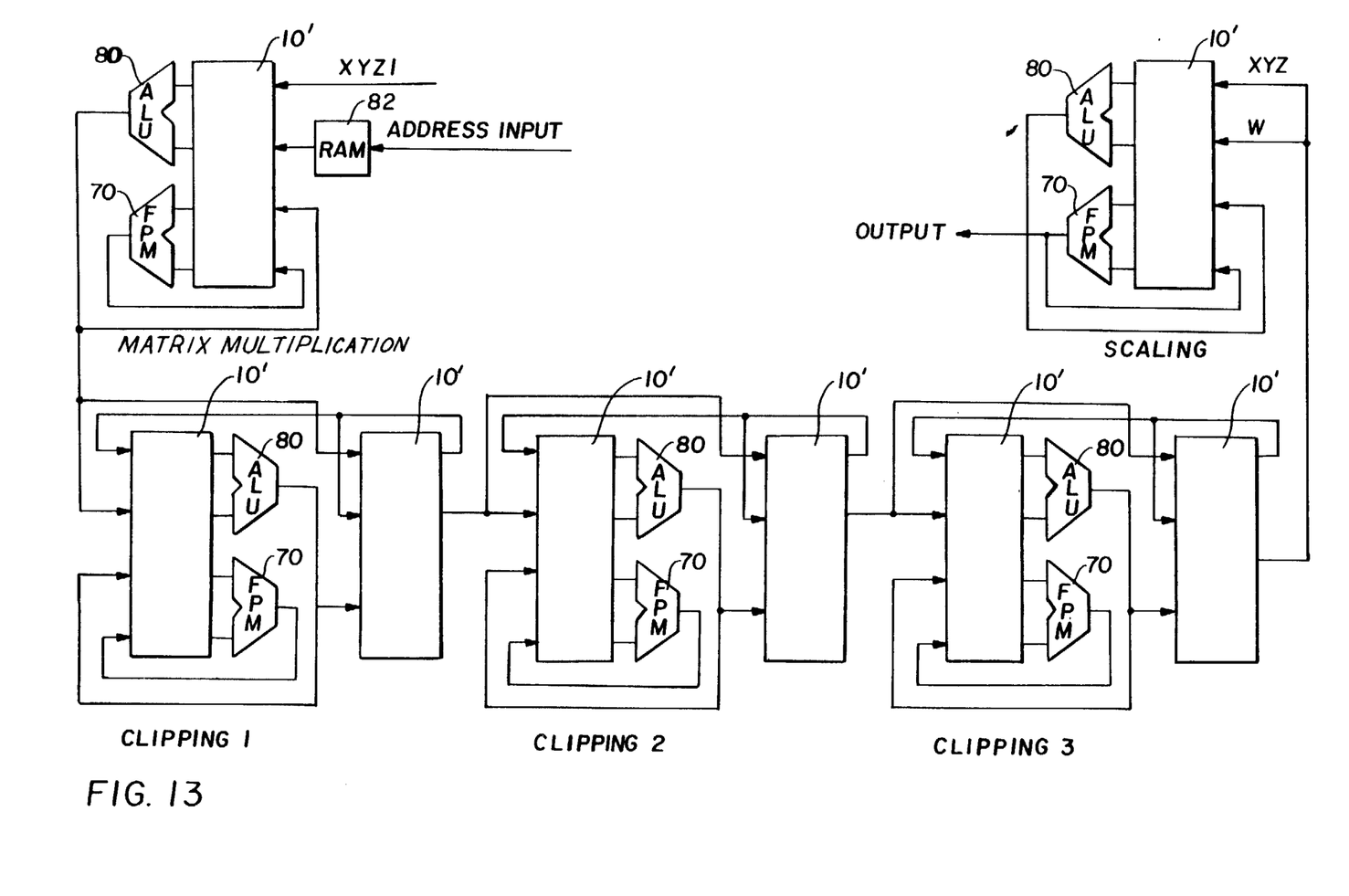
FIG. 13 is a schematic view showing a geometry system utilizing the chip of the present invention for use in connection with computer graphics.

FIG. 13 shows the implementation of the geometry system. The first cell performs the matrix multiplications, the next three cells do clipping, and the last cell does the scaling operation. Each cell is composed of 20 copies of chip 10, a floating-point multiplier (FPM) 70 and a floating-point arithmetic logic unit (ALU) 80. (In the figure, one chip 10' box represents two copies of chip 10).

The matrix multiplication cell has a random-access memory 82 which stores the coefficients of the homogeneous transformations. The cell inputs memory addresses and vertex vectors in world coordinates [x, y, z, 1]. The transformed coordinates of a vertex vector are output every 32 chip 10' cycles.

Given an input point, each of the clipping cells clips every edge of a polygon by two planes that are parallel in normalized device coordinates, such as x−w=0 and x+w=0. The first part of a clipping cell computes the two intersections of an infinite line with the two planes. The second part selects at most two points from the input point and the two intersection points. These selected points correspond to the end points of the edge of the polygon between the planes. Notice that data may be output at different rates. That is, even though the data output rate from the matrix multiplier cell is constant ( vector per 32 chip 10 cycles), each clipping cell has the possibility of outputting no points, 1 point or 2 points. The FIFOs in chip 10 are useful for smoothing this variance in I/O rates between cells. In particular the chip 10 at the input of each clipping cell provides a FIFO to buffer inputs which may arrive in bursts.

The scaling cell performs divisions to compute [x/w, y/w, z/w]. This can be efficiently implemented, for example, by a custom chip presently being designed that is capable of computing reciprocals of 32-bit floating-point numbers at the rate of one every 200 ns. However, if no special hardware for divisions is assumed, we can still use existing schemes that can replace a quotient computation (no remainder) with a few multiplications. In particular, for 32-bit floating point numbers with a 24-bit mantissa, computing the inverse of w takes no more than eighteen chip 10 cycles. With the addition of six chip 10 cycles required for multiplying x, y and z by the inverse of w, we need no more than a total of 24 chip 10' cycles to scale one vertex vector.

Each cell in FIG. 13 is capable of computing one result vector in 32 chip 10 cycles (3.2 μs). Therefore the maximum throughput of this system is approximately 9K vertices in one frame period (30 ms).

Whereas particular embodiments of the invention have been described above for the purpose of illustration, it will be appreciated by those skilled in the art that numerous variations of the details may be made without departing from the invention as described in the appended claims.

I claim:

1. A programmable interconnection chip for use in interconnecting major components of a processor such as arithmetic logic units, floating point multipliers, processor memory and processor register files to provide physical communication and data buffering between such components comprising:

(a) programmable data input buffer and flow control means including a plurality of data input ports;

(b) programmable pipeline register file output means including a plurality of data output ports;

(c) crossbar interconnection means electrically connected between the data input buffer and flow control means and the pipeline register file output means, said crossbar interconnection means configured on each clock cycle to provide a desired interconnection pattern in a manner allowing multiple data transfers to flow in parallel between the data input buffer and flow control means and the pipeline register file output means in accordance with said pattern; and (d) control pattern memory means electrically connected to the crossbar interconnection means and the pipeline register file output means for storing programmed instructions designed to control the configuration of the interconnection pattern and the operations of the crossbar interconnection means on each clock cycle and to control shifting of data into and output of data from the pipeline register file output means on each clock cycle, said electrical connection of the control pattern memory means to the crossbar interconnection means being independent of said electrical connection between the crossbar interconnection means and the data input buffer and control means.

2. A programmable interconnection chip according to claim 1 wherein each data input buffer and flow control means is programmed to comprise one of a FIFO means and a programmable delay means.

3. A programmable interconnection chip according to claim 1 wherein the crossbar interconnection means is unidirectional and only allows data to flow from the input buffer and flow control means to the pipeline register file output means.

4. A programmable interconnection chip according to claim 1 wherein the control pattern memory means is configured into two memory banks.

5. A programmable interconnection chip according to claim wherein one of said two memory banks may be programmed with new control patterns while the other of said two banks controls the configuration and operation of the crossbar interconnection means and pipeline register file output means.

6. A programmable interconnection chip according to claim 1 wherein programmed instructions contained in the control pattern memory means determine whether each pipeline register file output means will store a current crossbar interconnection means output.

7. A programmable interconnection chip according to claim 1 in which a minimum delay of one clock cycle results between an input of data into the data input buffer and flow control means and output of data from the pipeline register file output means.

8. A programmable interconnection chip according to claim 1 further comprising delay code register means electrically connected to the data input buffer and flow control means for configuring said data input buffer and flow control means as one of a FIFO means and a programmable delay means.

9. A programmable interconnection chip according to claim 8 wherein the delay code register means sends programmed instructions to each data input buffer and flow control means causing each to be configured as one of a FIFO means and a programmable delay means.

10. A programmable interconnection chip according to claim 1 for use in interconnecting processor components with a maximum data path of n-bits.

11. A programmable interconnection chip according to claim 10 in combination with at least one additional programmable interconnection chip for use in interconnecting components of a processor with data paths wider than n-bits, said programmable interconnection chip and said at least one additional programmable interconnection chip being electrically interconnected.

12. A programmable interconnection chip according to claim 11 in combination with at least one additional programmable interconnection chip for use in interconnecting components of a processor wherein each input port of said programmable interconnection chip is interconnected to a corresponding input port of said at least one additional programmable interconnection chip.

13. A programmable interconnection chip according to claim 11 in combination with at least one additional programmable interconnection chip for use in interconnecting components of a processor wherein each output port of said programmable interconnection chip is interconnected to a corresponding output port of said at least one additional programmable interconnection chip by tri-stating whereby at most one of said interconnected output ports is enabled on each clock cycle.

14. A programmable interconnection chip according to claim 11 in combination with a second, third and fourth additional programmable interconnection chip wherein each input port of said programmable interconnection chip and said third programmable interconnection chip is interconnected to a corresponding input port of said second and said fourth programmable interconnection chips, respectively, and each output port of said programmable interconnection chip and said second programmable interconnection chip is interconnected to a corresponding output port of said third and forth chips, respectively, by tri-stating whereby at most one of said interconnected output ports is enabled on each clock cycle.

15. A programmable interconnection chip according to claim 10 having a generally rectangular shape and having input ports provided along one edge thereof and output ports provided along an adjacent edge thereof.

16. A programmable interconnection chip according to claim 15, in combination with a second, third and fourth programmable interconnection chip, each of said second, third and fourth programmable interconnection chips being provided in a common plane with said programmable interconnection chip, said programmable interconnection chip and said second programmable interconnection chip being longitudinally juxtaposed, said third and fourth programmable interconnection chips being longitudinally juxtaposed, said programmable interconnection chip and said third programmable interconnection chip being transversely juxtaposed and said second and said fourth programmable interconnection chips being transversely juxtaposed whereby a compact and regular layout of interconnection lines between chips is provided.

* * * * *

UNITED STATES PATENT AND TRADEMARK OFFICE
CERTIFICATE OF CORRECTION

PATENT NO. : 4,807,183

DATED : Feb. 21, 1989

INVENTOR(S) : Kung et al.

It is certified that error appears in the above-identified patent and that said Letters Patent is hereby corrected as shown below:

Column 9, line 39, after "cycles" insert --into the pipelines of the processing units. It is also important--.

Column 9, line 65, after "controller" insert --.--.

Column 11, line 42, after "stant (" insert --1--.

Column 12, line 52, after "claim" insert --4--.

Signed and Sealed this

Fifteenth Day of May, 1990

Attest:

HARRY F. MANBECK, JR.

*Attesting Officer*  *Commissioner of Patents and Trademarks*